United States Patent
Shim et al.

(10) Patent No.: US 9,293,475 B2
(45) Date of Patent: Mar. 22, 2016

(54) DISPLAY DEVICE AND METHOD OF MANUFACTURING THE SAME

(71) Applicant: Samsung Display Co., Ltd., Yongin-si, Gyeonggi-do (KR)

(72) Inventors: Seung-Bo Shim, Asan-si (KR); Dong-Hyun Yu, Gwacheon-si (KR); Jin-Ho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/316,523

(22) Filed: Jun. 26, 2014

(65) Prior Publication Data
US 2015/0162356 A1 Jun. 11, 2015

(30) Foreign Application Priority Data
Dec. 6, 2013 (KR) .................... 10-2013-0151122

(51) Int. Cl.
| | |
|---|---|
| *H01L 27/12* | (2006.01) |
| *G03F 1/00* | (2012.01) |
| *H01L 21/027* | (2006.01) |
| *H01L 21/311* | (2006.01) |
| *H01L 29/66* | (2006.01) |
| *H01L 21/32* | (2006.01) |
| *H01L 51/05* | (2006.01) |

(52) U.S. Cl.
CPC .............. *H01L 27/1214* (2013.01); *G03F 1/00* (2013.01); *H01L 21/0274* (2013.01); *H01L 21/31144* (2013.01); *H01L 27/1259* (2013.01); *H01L 21/32* (2013.01); *H01L 29/66757* (2013.01); *H01L 51/0541* (2013.01); *H01L 51/0545* (2013.01)

(58) Field of Classification Search
CPC . H01L 27/1214; H01L 27/1259; H01L 21/32; H01L 21/775; H01L 27/12; H01L 29/66757; H01L 29/78621; H01L 21/363; H01L 51/0545; H01L 51/0541; G02F 1/136216
USPC ................. 257/72, 40, 59, 66, 347, E21.005, 257/E29.151; 438/82, 99, 48, 128; 349/43, 349/152
See application file for complete search history.

(56) References Cited

U.S. PATENT DOCUMENTS

| | | | | |
|---|---|---|---|---|
| 5,504,601 | A | * | 4/1996 | Watanabe et al. ............... 349/42 |
| 7,265,799 | B2 | * | 9/2007 | Souk et al. ...................... 349/43 |
| 8,704,991 | B2 | * | 4/2014 | Chang et al. ................... 349/149 |

(Continued)

FOREIGN PATENT DOCUMENTS

| | | |
|---|---|---|
| JP | 2013-54893 A | 3/2013 |
| KR | 10-2005-0011875 A | 1/2005 |

(Continued)

*Primary Examiner* — Thinh T Nguyen
(74) *Attorney, Agent, or Firm* — Knobbe Martens Olson & Bear LLP

(57) ABSTRACT

A display device includes a substrate including a first region and a second region, a gate line and a data line on the substrate, a thin film transistor on the substrate, being connected to the gate line and the data line, and a pixel electrode connected to the thin film transistor, wherein the second region has a second contact hole of which an area is larger than that of a first contact hole of the first region.

6 Claims, 10 Drawing Sheets

(56) References Cited

U.S. PATENT DOCUMENTS

| | | |
|---|---|---|
| 2002/0063824 A1* | 5/2002 | Ha et al. .................. 349/113 |
| 2004/0070698 A1* | 4/2004 | Choi et al. ................ 349/43 |
| 2004/0183955 A1* | 9/2004 | Souk et al. ............... 349/43 |
| 2005/0018111 A1 | 1/2005 | Tak |
| 2005/0142458 A1 | 6/2005 | Lee et al. |
| 2007/0291195 A1* | 12/2007 | Kim et al. ................ 349/44 |
| 2009/0121982 A1* | 5/2009 | Choi et al. ............... 345/76 |
| 2009/0297958 A1 | 12/2009 | Lee et al. |

FOREIGN PATENT DOCUMENTS

| | | |
|---|---|---|
| KR | 10-2005-0066426 A | 6/2005 |
| KR | 10-2005-0070365 A | 7/2005 |
| KR | 10-2005-0097173 A | 10/2005 |
| KR | 10-2007-0000766 A | 1/2007 |
| KR | 10-2007-0052035 A | 5/2007 |
| KR | 10-2007-0052398 A | 5/2007 |
| KR | 10-2010-0059107 A | 6/2010 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2013-0151122, filed on Dec. 6, 2013, with the Korean Intellectual Property Office, the disclosure of which is incorporated herein in its entirety by reference.

BACKGROUND

1. Field

The described technology generally relates to a display device.

2. Description of the Related Technology

Flat panel displays such as liquid crystal displays (LCDs) and organic light-emitting diode (OLED) displays include a pair of electric field generating electrodes and an electro-optical active layer interposed therebetween. A liquid crystal layer is included as the electro-optical active layer in LCDs and an organic emission layer is included as the electro-optical active layer in OLED displays.

One of the electrodes is electrically connected to a switching element to receive a driving signal. The electro-optical active layer displays an image by converting the driving signal into an optical signal.

SUMMARY OF CERTAIN INVENTIVE ASPECTS

One inventive aspect is a display device in which contact holes in overlapping light-exposed regions of a substrate each have a larger area than contact holes in different regions One inventive aspect is a display device having contact holes formed by using an exposure mask in which a third mask pattern of a third light transmitting portion has a larger area than a first mask pattern of a first light transmitting portion and a second mask pattern of a second light transmitting portion and a method of manufacturing the display device.

Another aspect is a display device including a substrate including first and second regions, a gate line and a data line on the substrate, a thin film transistor on the substrate, being connected to the gate line and the data line, and a pixel electrode connected to the thin film transistor, wherein the second region has a second contact hole of which an area is larger than that of a first contact hole of the first region.

The area of the second contact hole may be about 1.3 times to about 1.5 times the area of the first contact hole.

The first contact hole may be provided in the same layer as the second contact hole.

The first contact hole and the second contact hole may expose any one of a semiconductor layer, a drain electrode, a gate line, a data line, and a pad electrode.

The second region may include any one of the gate line and the data line.

The second region may include a driving circuit.

Another aspect is an exposure mask including a first light transmitting portion provided with a plurality of first mask patterns, a second light transmitting portion on the left and right sides of the first light transmitting portion and provided with a plurality of second mask patterns, and a third light transmitting portion between the first and second light transmitting portions and provided with a plurality of third mask patterns, wherein the third mask pattern has a larger area than the first and second mask patterns.

The first, second, and third mask patterns may be any one of a light transmitting area and a light blocking area.

The first, second, and third mask patterns may be a contact hole-forming pattern.

The contact hole-forming pattern may be circular or polygonal in shape.

The contact hole-forming pattern may include a first light exposed portion, a first light blocking portion surrounding the first light exposed portion, a second light exposed portion surrounding the first light blocking portion, and a second light blocking portion surrounding the second light exposed portion, wherein the second light exposed portion may have a slit shape.

The contact hole-forming pattern may include a first light blocking portion, a first light exposed portion surrounding the first light blocking portion, a second light blocking portion surrounding the first light exposed portion, and a second light exposed portion surrounding the second light blocking portion, wherein the second light blocking portion may have a slit shape.

Another aspect is a method of manufacturing a display device including forming a non-etched layer on a substrate including at least three first regions and a second region between the at least three first regions, coating a photoresist on the non-etched layer, first exposing in which a first photoresist coated on the first region and another first photoresist coated on the second region adjacent to the first region are exposed to different light intensities using an exposure mask, second exposing in which a second photoresist coated on the first region and another second photoresist coated on the second region adjacent to the first region are exposed to different light intensities using an exposure mask, third exposing in which a third photoresist coated on the first region and another third photoresist coated on the second region adjacent to the first region are exposed to different light intensities using an exposure mask, forming a photoresist pattern by developing the exposed photoresist, etching the non-etched layer on the substrate using the photoresist pattern, and stripping the photoresist pattern.

The intensity of light irradiated to the second region may be about 1% to about 50% of the intensity of light irradiated to the first region.

The exposure mask may include a first light transmitting portion provided with a plurality of first mask patterns, a second light transmitting portion on the left and right sides of the first light transmitting portion, being provided with a plurality of second mask patterns, and a third light transmitting portion between the first and second light transmitting portions, being provided with a plurality of third mask patterns, wherein the third mask pattern may have a larger area than the first and second mask patterns.

Another aspect is a display device including a substrate having a first region and a second region, a plurality of gate lines and a plurality of data lines formed over the substrate, a plurality of thin film transistors (TFTs) formed over the substrate and electrically connected to the gate lines and the data lines, a plurality of insulating layers formed over the substrate, wherein a plurality of first contact holes are formed in at least one of the insulating layers in the first region and wherein a plurality of second contact holes are formed in at least one of the insulating layers in the second region, and a plurality of pixel electrodes electrically connected to the TFTs, wherein the area of each of the second contact holes is greater than the area of each of the first contact holes.

The area of each of the second contact holes is about 1.3 times to about 1.5 times the area of each of the first contact holes. Each of the first and second contact holes is formed in the same insulating layer. Each of the first and second contact holes is formed directly over one of a semiconductor layer, a drain electrode, a gate line, a data line, and a pad electrode. The second region includes the gate lines or the data lines. The second region includes a driving circuit.

Another aspect is an exposure mask including a first light transmitting portion having a plurality of first mask patterns, a second light transmitting portion formed on opposing sides of the first light transmitting portion and including a plurality of second mask patterns, and a third light transmitting portion interposed between the first and second light transmitting portions and including a plurality of third mask patterns, wherein the area of each of the third mask patterns is greater than the area of each of the first and second mask patterns.

The first, second, and third mask patterns are respectively formed in a light transmitting area or a light blocking area. The first, second, and third mask patterns respectively have a shape configured to form a contact hole in a substrate. The first, second, and third mask patterns respectively have a substantially circular or polygonal shape. The first, second, and third patterns respectively include a first light transmitting area, a first light blocking area surrounding the first light transmitting area, a second light transmitting area surrounding the first light blocking area, and a second light blocking area surrounding the second light transmitting area, wherein the second light transmitting area has a slit shape. The first, second, and third patterns respectively include a first light blocking area, a first light transmitting area surrounding the first light blocking area, a second light blocking area surrounding the first light transmitting area, and a second light transmitting area surrounding the second light blocking area, wherein the second light blocking area has a slit shape.

Another aspect is a method of manufacturing a display device including providing a substrate including first, second, and third regions neighboring each other, wherein an insulating layer is formed over the substrate in each of the regions, coating a photoresist on the insulating layer, exposing the photoresist in the first and second regions through an exposure mask such that the intensity of light irradiated onto each of the first and second regions is different, exposing the photoresist in the second and third regions through the exposure mask such that the intensity of light irradiated onto each of the second and third regions is different, developing the exposed photoresist, etching the insulating layer, and stripping the developed photoresist.

The intensity of light irradiated onto the second region in each of the exposures is in the range of about 1% to about 50% of the intensity of light irradiated onto the first region. The exposure mask includes a first light transmitting portion including a plurality of first mask patterns, a second light transmitting portion formed on opposing sides of the first light transmitting portion and including a plurality of second mask patterns, and a third light transmitting portion interposed between the first and second light transmitting portions and including a plurality of third mask patterns, wherein the area of each of the third mask patterns is greater than the area of each of the first and second mask patterns.

According to at least one embodiment, the display device effectively forms contact holes in the overlapping light-exposed area of the substrate, thereby improving image quality.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Figure 1:
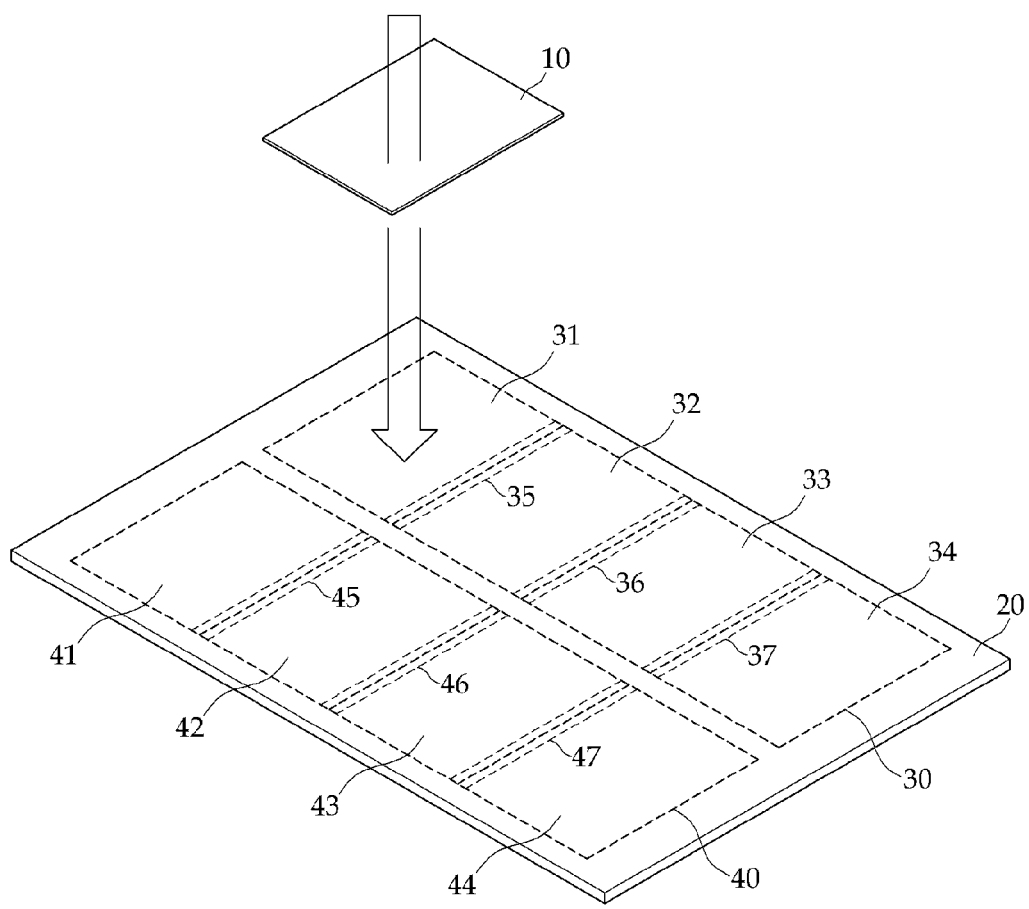
FIG. 1 is a schematic diagram showing divisional exposure using a stepper method.

Display devices are being manufactured with areas that are larger than the standard mask size. Thus, in order to pattern the entire area of these large displays, the area is divided into smaller areas corresponding to the mask size and repeatedly exposed to pattern the entire area. This divisional exposure method requires multiple shots (i.e. multiple exposures). When repositioning the mask, a shift, rotation, or distortion can occur from the ideal alignment, thereby causing misalignment between the shots. This misalignment results in stitch defects. The stitch defects manifest at the boundary between the shots due to a difference in brightness between the two shots.

Advantages and features of the described technology and methods for achieving them will be made clear from the embodiments described below in detail with reference to the accompanying drawings. The described technology may, however, be embodied in many different forms and should not be construed as being limited to the embodiments set forth herein. Rather, these embodiments are provided so that this disclosure will be thorough and complete, and will fully convey the scope of the described technology to those skilled in the art. The described technology is only defined by the scope of the claims. Therefore, well-known constituent elements, operations and techniques are not described in detail in the following embodiments in order to prevent the described technology from being obscured by unnecessary detail Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, when a device shown in the drawing is turned over, components originally positioned "below" or "beneath" another component are then oriented "above" the other component. Accordingly, the illustrative term "below" may include both the lower and upper positions. The device may also be oriented in other directions, and the spatially relative terms are to be interpreted depending on the orientations.

The terminology used herein is for the purpose of describing particular embodiments only and is not construed as limiting of the described technology. As used herein, the singular forms "a," "an," and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which the described technology pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, divisional exposure using a stepper method will be described in detail with reference to FIGS. 1 to 4.

A mother substrate 20 illustrated in FIG. 1 includes a thin film (i.e. a metal layer, insulating layer, semiconductor layer, or the like) for patterning and a photoresist (not shown) formed on the thin film. The photoresist is patterned by transferring the pattern of a mask 10 via a light exposure process to the photoresist and developing the patterned photoresist. By exposing the photoresist to light through a mask 10, a photoresist pattern is formed corresponding to the pattern of the mask 10 during the exposure process. When the mother substrate 20 is larger than the mask 10, the photoresist is exposed to light via a stitch exposure method in which the exposure process is repeated for different positions of the mask 10. As used herein, a single exposure process using the mask is referred to as a "shot" and the area of the substrate exposed to the light during one shot is called a "shot area."

In the FIG. 1 embodiment, the mother substrate 20 is a large substrate and includes two substrates. The mother substrate 20 includes a first substrate 30 and a second substrate 40. The first substrate 30 includes first regions 31, 32, 33, and 34, and second regions 35, 36, and 37. The second substrate 40 includes first regions 41, 42, 43, and 44, and second regions 45, 46, and 47. The first regions 31, 32, 33, 34, 41, 42, 43, and 44 each include one shot area. Therefore, the entire mother substrate 20 of FIG. 1 is partitioned into 8 shot areas (31 to 44), each individually exposed to light in separate shots. In other words, the mask 10 of FIG. 1 is sequentially moved for each shot and the photoresist (not shown) is sequentially exposed in each of the 8 shot areas (31 to 44).

The first regions of the first and second substrates 30 and 40 are individually exposed using the exposure mask 10 and the second regions of the first and second substrates 30 and 40 are overlappingly exposed. That is, each of the second regions is exposed in more than one shot.

The second regions 35, 36, 37, 45, 46, and 47 may include a gate line (not shown) or a data line (not shown), or may include a driver circuit (not shown). For example, the second regions 35, 36, 37, 45, 46, and 47 can be regions neighboring pixel electrodes and can include a data line between pixels. The driver circuit can be any one of scan driver (not shown), data driver (not shown), and driver integrated circuit (IC) (not shown), or can be a wire configured to connect the one of the scan driver, the data driver, and the driver IC and apply signals received therefrom.

Hereinafter, the overlapping exposure of the second regions 35, 36, 37, 45, 46, and 47 will be described.

Hereinafter, the first regions 31, 32, 33, and 34 are respectively referred to as a "first sub-region," "second sub-region," "third sub-region," and "fourth sub-region." Similarly, the second regions 35, 36, and 37 are respectively referred to as a "fifth sub-region," "sixth sub-region," and "seventh sub-region." According to some embodiments, the first and fourth sub-regions are about 1.5 times larger than the second and third sub-regions. In other words, the first sub-region is about 1.5 times as large as the second sub-region.

The divisional exposure process will be described in more detail with respect to the overlapping exposure as follows.

Figure 2:
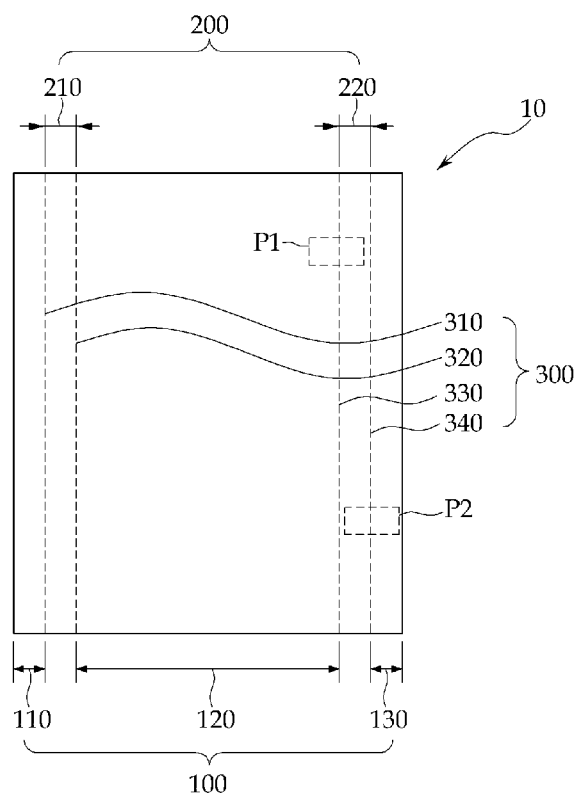
FIG. 2 is a plan view showing an exposure mask according to an embodiment.

The mask 10 of FIG. 2 includes a single exposed portion 100 and an overlapping exposed portion 200. The single exposed portion 100 includes a first light transmission portion 120 and second light transmission portions 110 and 130. The overlapping exposed portion 200 includes third light transmission portions 210 and 220. As shown in FIG. 2, each of the first, second, and third light transmission portions 120, 110, 130, 210, and 220 is separated by boundaries 300. The boundaries 300 are formed of a plurality of boundaries 310, 320, 330, and 340.

Comparisons will be made below between one substrate and the exposure mask 10 in terms of their relative sizes prior to describing the divisional exposure method according to an embodiment.

The first light transmission portion 120 of the exposure mask 10 is substantially identical in size to the second and third sub-regions 32 and 33 of the first substrate 30. The second light transmission portions 110 and 130 have substantially the same size as boundary areas 31a, 32a, 32b, 33a, 33b, and 34b. The third light transmission portions 210 and 220 have substantially the same size as the fifth, sixth, and seventh sub-regions 35, 36, and 37. The exposure mask 10 has substantially the same size as a combined area of the first sub-region 31, the fifth sub-region 35, and the boundary area 32b. In other words, the combined area of the first sub-region 31 and the fifth sub-region 35 is substantially the same as an area excluding the second light transmission portion 130 from the total area of the exposure mask 10.

When the maximum intensity of light irradiated by an exposer or light source is defined as a light intensity of 100%, the exposer (not shown) irradiates light having a light intensity of about 100% to the single exposed portion 100 and irradiates light having a light intensity of about 1% to about 50% to the overlapping exposed portion 200. This is because the first regions 31, 32, 33, 34, 41, 42, 43, and 44 of the mother substrate 20 corresponding to the single exposed portion 100 are exposed to light once and the second regions 35, 36, 37, 45, 46, and 47 of the mother substrate 20 corresponding to the overlapping exposed portion 200 are exposed to light twice. That is, the light intensity irradiated onto the second regions 35, 36, 37, 45, 46, and 47 can be set to about 1% to about 50% for each shot so that the total light exposure after two shots onto the second regions 35, 36, 37, 45, 46, and 47 is about 100%.

Figure 3:
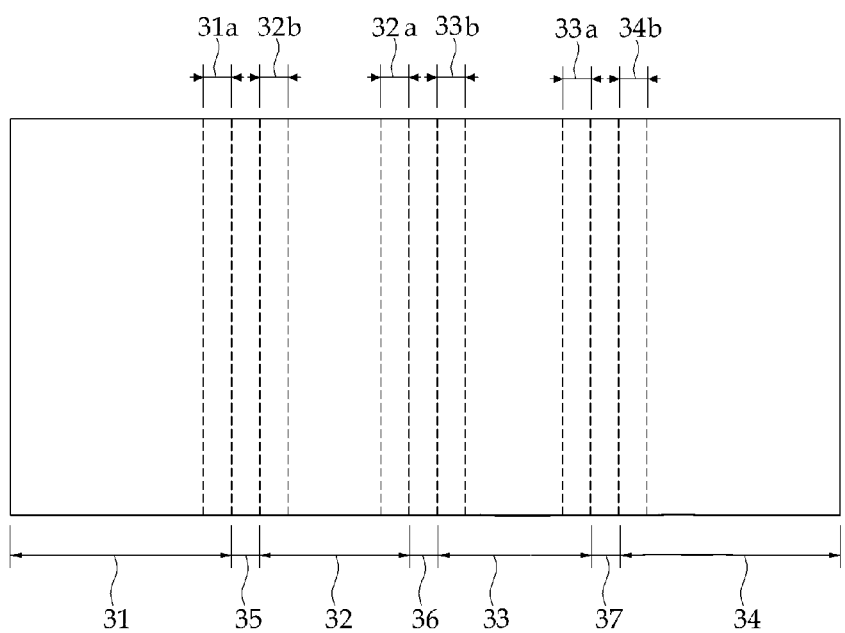
FIG. 3 is a plan view showing a first substrate of a mother substrate.

The divisional exposure applied to neighboring regions of the mother substrate 20 will be described below with reference to the first sub-region 31, the fifth sub-region 35, and the second sub-region 32 included in the first substrate 30 of the mother substrate 20 as illustrated in FIG. 3.

In a first shot, the exposure mask 10 is positioned over the first sub-region 31, the fifth sub-region 35, and the boundary area 32b. In the first shot, the second light transmission portion 130 of the right side of the exposure mask 10 is covered with a mask blind (not shown) so that the boundary area 32b is not exposed to light. The exposer irradiates light with an intensity of about 100% onto the second light transmission portion 110 of the left side of the exposure mask 10, the third light transmission portion 210 of the left side of the exposure mask 10, and the first light transmission portion 120. The light with an intensity of 100% is irradiated onto the first sub-region 31 through the exposure mask 10. Further, the exposer irradiates light with an intensity of about 1% to about 50% onto the third light transmission portion 220 of the right side of the exposure mask 10 and the light with and intensity of about 1% to about 50% can be irradiated onto the fifth sub-region 35 through the exposure mask 10.

In a second shot, the exposure mask 10 is positioned over the boundary area 31a, the fifth sub-region 35, the second sub-region 32, the sixth sub-region 36, and the boundary area 33b. In the second shot, the second light transmission portions 110 and 130 of the exposure mask 10 are covered with a mask blind (not shown) so that the boundary areas 31a and 33b are not exposed to light. The exposer irradiates light with an intensity of about 100% onto the first light transmission portion 120 of the exposure mask 10. The light with an intensity of 100% is irradiated onto the second sub-region 32 of the first substrate 30 through the exposure mask 10. Further, the exposer can irradiate light with an intensity of about 1% to about 50% onto the third light transmission portions 210 and 220 of the left and right sides of the exposure mask 10 and the light with an intensity of about 1% to about 50% can be irradiated onto the fifth and sixth sub-regions 35 and 36 of the first substrate 30 through the exposure mask 10. Therefore, the fifth sub-region 35 is exposed to light twice by a combination of the first and second shots.

Third and fourth shots proceed in the same way as the first and second shots described above.

Figure 4:
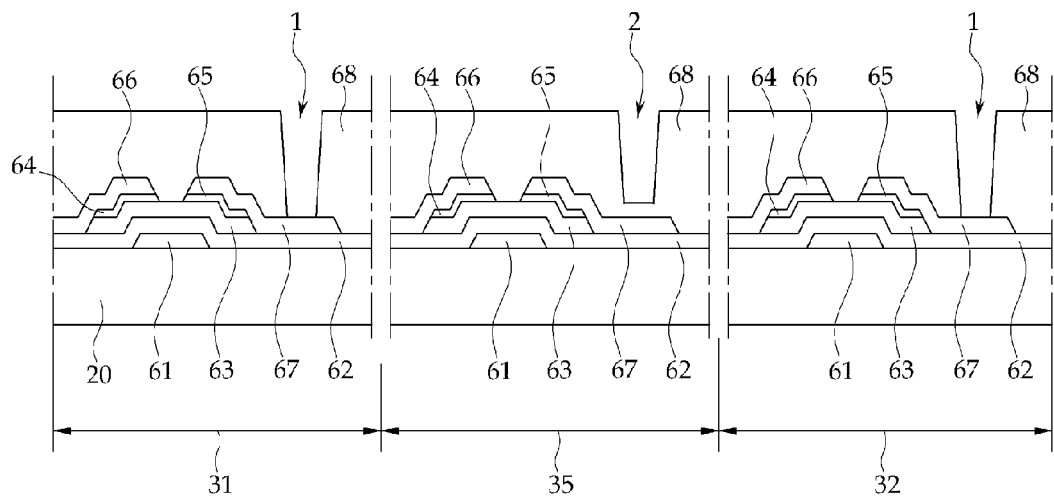
FIG. 4 is a cross-sectional view of a contact hole formed after being exposed to light using a standard mask.

When performing divisional exposure as illustrated in FIGS. 1 to 3, the light intensity irradiated onto the second regions 35, 36, 37, 45, 46, and 47, corresponding to the overlapping exposed portions, is adjusted to be less than 100%. In this example, the pattern sizes are not different from each other between the second regions 35, 36, 37, 45, 46, and 47 corresponding to the boundary areas of each shot and the first regions 31, 32, 33, 34, 41, 42, 43, and 44 corresponding to the single exposed portion because the total intensity of light irradiated onto the second regions 35, 36, 37, 45, 46, and 47 does not exceed 100%. However, when the second regions 35, 36, 37, 45, 46, and 47 are exposed twice, the intensity of light irradiated onto these regions does not always add up to 100%, and the total intensity of light irradiated into the second regions 35, 36, 37, 45, 46, and 47 is less than 100%. This reduction in light intensity can cause a defective contact hole 2 which is not fully open as illustrated in FIG. 4. In other words, the light intensity irradiated onto the second regions 35, 36, 37, 45, 46, and 47 is not sufficient such that some of the contact holes 2 fail to expose a drain electrode 67 since they are not fully opened.

According to some embodiments, the exposure mask is modified to solve the above problem and the configuration of the modified mask will be described below with reference to FIGS. 5 and 6.

Figure 5:
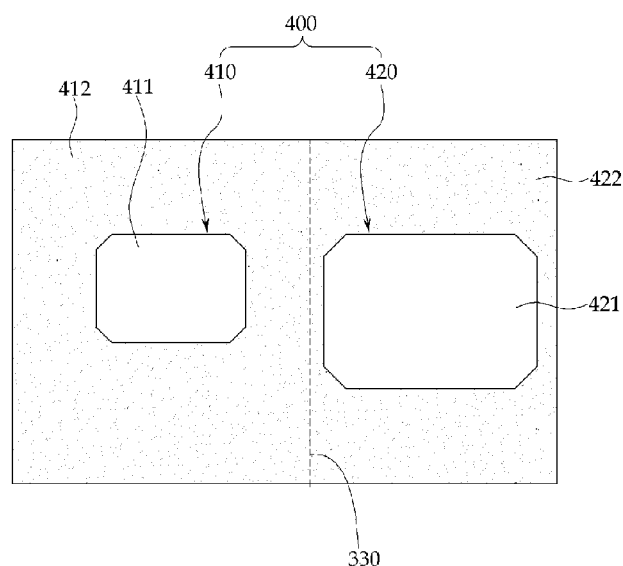
FIG. 5 is an enlarged plan view of area P1 of FIG. 2.

FIG. 5 is an enlarged plan view of area P1 of FIG. 2. FIG. 6 is an enlarged plan view of area P2 of FIG. 2.

Figure 6:
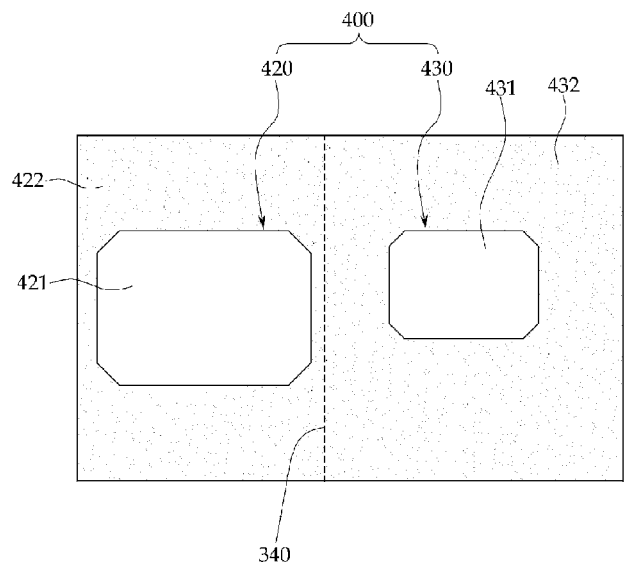
FIG. 6 is an enlarged plan view of area P2 of FIG. 2.

Referring to FIGS. 2, 5, and 6, the exposure mask includes the first light transmitting portion 120, the second light transmitting portions 110 and 130, and the third light transmitting portions 210 and 220.

The second light transmitting portions 110 and 130 are formed at a left and right sides of the first light transmitting portion 120. The third light transmitting portions 210 and 220 are formed between the first light transmitting portion 120 and the second light transmitting portions 110 and 130. The third light transmitting portion 210 and the second light transmitting portion 110 are formed to be adjacent to the left side of the first light transmitting portion 120 and the third light transmitting portion 220 and the second light transmitting portion 130 are formed to be adjacent to the right side of the first light transmitting portion 120. According to some embodiments, a pattern to be formed in a display area is formed on the first light transmitting portion 120 and a pattern to be formed in a non-display area is formed on the third light transmitting portions 210 and 220. In these embodiments, the second light transmitting portions 110 and 130 include a pattern for forming components such as a driver circuit in a non-display area.

In order to prevent the defective contact holes as described above, in the exposure mask 10, a third mask pattern 420 on the third light transmitting portions 210 and 220 has a larger area than a first mask pattern 410 on the first light transmitting portion 120 and a second mask pattern 430 on the second light transmitting portions 110 and 130.

The first, second, and third mask patterns 410, 430, and 420 are any one of a light exposed area (or a light transmitting area) and a light blocking area and can vary depending on the type of photoresist used such as a positive or negative photoresist.

According to some embodiments, the first, second, and third mask patterns 410, 430, and 420 are contact hole-forming patterns. The contact hole may expose, for example, a drain electrode of a thin film transistor (TFT). In other embodiments, the contact hole exposes any one of semiconductor layer, gate line, data line, and pad electrode. The shape of the contact hole-forming pattern will be described below with reference to FIGS. 10A to 10D.

Referring to FIG. 5, the first mask pattern 410 includes a light exposed area 411 corresponding to the shape of the contact hole and a light blocking area 412 surrounding the light exposed area 411. The third mask pattern 420 includes a light exposed area 421 corresponding to the shape of the contact hole and a light blocking area 422 surrounding the light exposed area 421. A positive photoresist is characterized in that a portion of the photoresist that is exposed to light is dissolved by a photoresist developer. Therefore, the light exposed area in an exposure mask 10 is formed to transmit light, corresponding to a portion where the contact hole is formed. When a negative photoresist is used, the light exposed areas 411 and 421 and the light blocking areas 412 and 422 are reversed.

The light exposed area 421 of the third mask pattern 420 on the third light transmitting portion 220 is about 1.3 times to about 1.5 times larger than the light exposed area 411 of the first mask pattern 410 on the first light transmitting portion 120.

Referring to FIG. 6, the second mask pattern 430 includes a light exposed area 431 corresponding to the shape of the contact hole and a light blocking area 432 surrounding the light exposed area 431. The light exposed area 421 of the third mask pattern 420 on the third light transmitting portion 220 is about 1.3 times to about 1.5 times larger than the light exposed area 431 of the second mask pattern 430 on the second light transmitting portion 130.

As the light exposed area 421 of the third mask pattern 420 on the third light transmitting portions 210 and 220 corresponding to the second regions 35, 36, 37, 45, 46, and 47 of the mother substrate 20 increases, the light intensity irradiated onto a contact hole-forming part of the second regions 35, 36, 37, 45, 46, and 47 increases. In other words, as the light exposed area 421 of the third mask pattern 420 increases, defects in the contact holes of the second regions 35, 36, 37, 45, 46, and 47 can be prevented.

A configuration of a display device including a contact hole applied with a mask pattern 400 described above will be described below with reference to FIGS. 2, 7, and 8.

Figure 7:
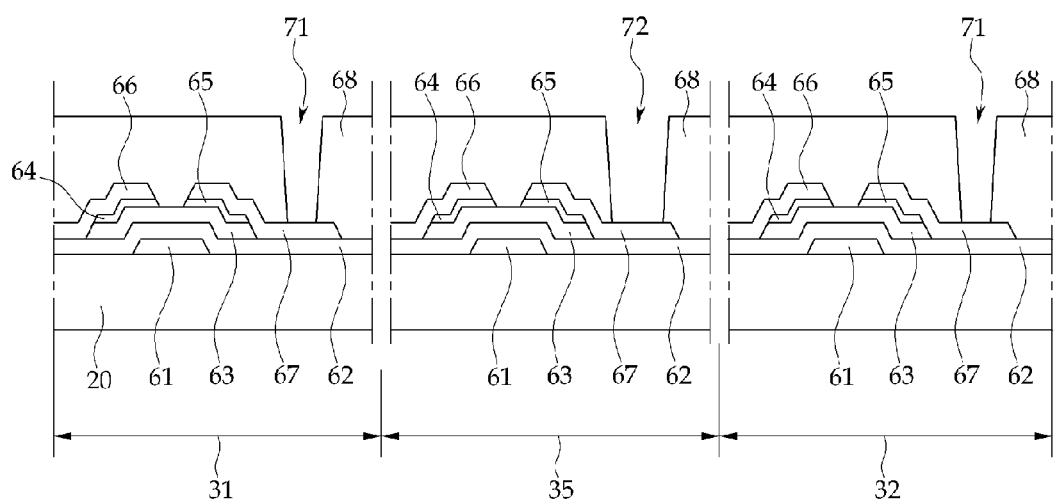
FIG. 7 is a cross-sectional view of first and second regions of a display device according to an embodiment.

FIG. 7 is a cross-sectional view of first and second regions of a display device according to an embodiment. FIG. 8 is a plan view showing first and second contact holes illustrated in FIG. 7.

A configuration of a thin film transistor array substrate of the display device will be described below prior to describing the process of forming contact holes 71 and 72 in a passivation layer 68.

Figure 8:
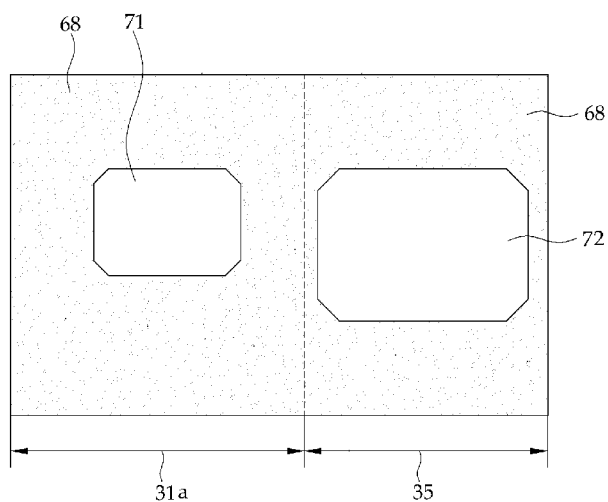
FIG. 8 is a plan view showing the first and second contact holes illustrated in FIG. 7.

Referring to FIGS. 2, 7, and 8, a gate line (not shown) and a gate electrode 61 are formed on the mother substrate 20 which is formed of glass, plastic, or the like. The gate line (not shown) includes an end portion (not shown) having a wide area for connection of a plurality of gate electrodes 61 protruding from the gate line and a different layer or an external driver circuit.

A gate insulating layer 62 formed of silicon nitride ($SiN_x$) or silicon oxide ($SiO_x$) is formed on the gate line (not shown) and the gate electrode 61.

A plurality of semiconductors 63 formed of hydrogenated amorphous silicon (a-Si refers to amorphous silicon), polysilicon, or the like are formed on the gate insulating layer 62. The semiconductor 63 extends in a longitudinal direction and includes a plurality of projections (not shown) extending toward the gate electrode 61.

The semiconductors 63 may be oxide semiconductors. The oxide semiconductors can include one or more of zinc (Zn), gallium (Ga), indium (In), and tin (Sn).

For example, the oxide semiconductor may be formed of an oxide based on zinc (Zn), gallium (Ga), tin (Sn), or indium (In), or an oxide semiconductor material, such as zinc oxide (ZnO), indium-gallium-zinc oxide ($InGaZnO_4$), Indium-zinc oxide (In—Zn—O), and zinc-tin oxide (Zn—Sn—O), which are complex oxide.

In detail, the oxide semiconductor may include an IGZO-based oxide including indium (In), gallium (Ga), zinc (Zn), and oxygen (O). In addition, the oxide semiconductor may include In—Sn—Zn—O-based metal oxide, In—Al—Zn—O-based metal oxide, Sn—Ga—Zn—O-based metal oxide, Al—Ga—Zn—O-based metal oxide, Sn—Al—Zn—O-based metal oxide, In—Zn—O-based metal oxide, Sn—Zn—O-based metal oxide, Al—Zn—O-based metal oxide, In—O-based metal oxide, Sn—O-based metal oxide, Zn—O-based metal oxide, or a combination thereof.

A plurality of ohmic contacts 64 and 65 are formed on the semiconductor 63 to reduce contact resistance. The ohmic contacts 64 and 65 may be formed of a material such as n+ hydrogenated amorphous silicon which is doped with n-type impurities such as phosphorus (P) at a high concentration or may be formed of silicide.

A plurality of data lines (not shown) and a plurality of drain electrodes 67 are formed on the ohmic contacts 64 and 65 and the gate insulating layer 62.

Each data line (not shown) includes a plurality of source electrodes 66 extending toward the gate electrode 61 and an end portion (not shown) having a wide area for connection to a different layer or an external driver circuit.

The drain electrode 67 is separated from the data line (not shown) and faces the source electrode 66 with respect to the gate electrode 61.

In detail, the source electrode 66, the drain electrode 67, and the data line (not shown) may be formed of a refractory metal such as molybdenum, chromium, tantalum and titanium, or alloys thereof, and may have a multilayer structure that includes a refractory metal layer and low resistance conductive layer. The multilayer structure may include, for example, a double layer including a chromium or molybdenum (alloys thereof) lower layer and an aluminum (alloys thereof) upper layer, and a triple layer including a molybdenum (alloys thereof) lower layer, an aluminum (alloys thereof) intermediate layer, or a molybdenum (alloys thereof) upper layer or a combination thereof.

One gate electrode 61, one source electrode 66, and one drain electrode 67 formed one TFT, together with the projection (not shown) of the semiconductor 63 and a channel of the TFT is formed at the projection between the source electrode 66 and drain electrode 67.

A passivation layer 68 is formed on the gate line (not shown), the data line (not shown), the source electrode 66, the drain electrode 67, and an exposed part of the semiconductor 63. The passivation layer 68 may be formed of an inorganic insulator such as silicon nitride or silicon oxide, an organic insulator, or an insulator having a low dielectric constant.

The passivation layer 68 has a plurality of contact holes 71 and 72 respectively exposing the drain electrodes 67.

The first contact hole 71 is formed in the first regions 31, 32, 33, 34, 41, 42, 43, and 44 of the substrates 30 and 40. The second contact hole 72 is formed in the second regions 35, 36, 37, 45, 46, and 47 of the substrates 30 and 40. The first contact hole 71 is formed by single exposure and the second contact hole 72 is formed by overlapping exposures.

As illustrated in FIG. 8, the second contact hole 72 is about 1.3 times to about 1.5 times larger than the first contact hole 71. In some embodiments, the second contact hole 72 has an upper opening that is about 1.3 times to about 1.5 times larger than that of the first contact hole 71.

The first and second contact holes 71 and 72 are formed in the same layer and by the same process. The first and second contact holes 71 and 72 are not limited to exposing the drain electrode 67 of a TFT and in some embodiments expose any one of the semiconductor 63, the drain electrode 67, the gate line, the data line, and the pad electrode. In other words, according to some embodiment, the contact holes 71 and 72 formed by the divisional exposure process are various contact holes formed in the substrates 30 and 40 to expose different components.

A plurality of pixel electrodes (not shown) are formed on the passivation layer 68. The pixel electrode (not shown) may be formed of a transparent conductive material such as ITO or IZO, or a reflective metal such as aluminum, silver, or alloys thereof.

The pixel electrode (not shown) is physically and electrically connected to the drain electrode 67 through the contact holes 71 and 72 and receives data voltage from the drain electrode 67. An electric field is generated by the pixel electrode (not shown), to which the data voltage is applied, and a common electrode (not shown) of a different display panel (not shown) to which common voltage is applied, thereby manipulating the orientation of liquid crystal molecules of a liquid crystal layer (not shown) between the two electrodes. The pixel electrode and the common electrode form a capacitor (hereinafter referred to as a "liquid crystal capacitor") to maintain the applied voltage after the TFT is turned off.

According to other embodiments, when forming an OLED display, the OLED display includes an organic light-emitting layer (not shown) on the pixel electrode (not shown) and an opposite electrode (not shown) on the organic light-emitting layer.

The pixel electrode (not shown) is formed to correspond to an opening of a pixel defining layer (not shown), but it is not necessarily formed in the opening of the pixel defining layer. The pixel electrode may be formed under the pixel defining layer so that a portion of the pixel electrode overlaps the pixel defining layer. The pixel defining layer may be formed of a polyacrylate resin, polyimide resin, silica-based inorganic material, or the like.

The organic light-emitting layer (not shown) is formed on the pixel electrode and the opposite electrode (not shown) serving as a cathode electrode is formed on the organic light-emitting layer. As described above, the OLED display is formed to include the pixel electrode, the organic light-emitting layer, and the opposite electrode.

A method of forming the contact hole by applying the mask pattern 400 will be described below with reference to FIGS. 9A to 9C.

Figure 9A:
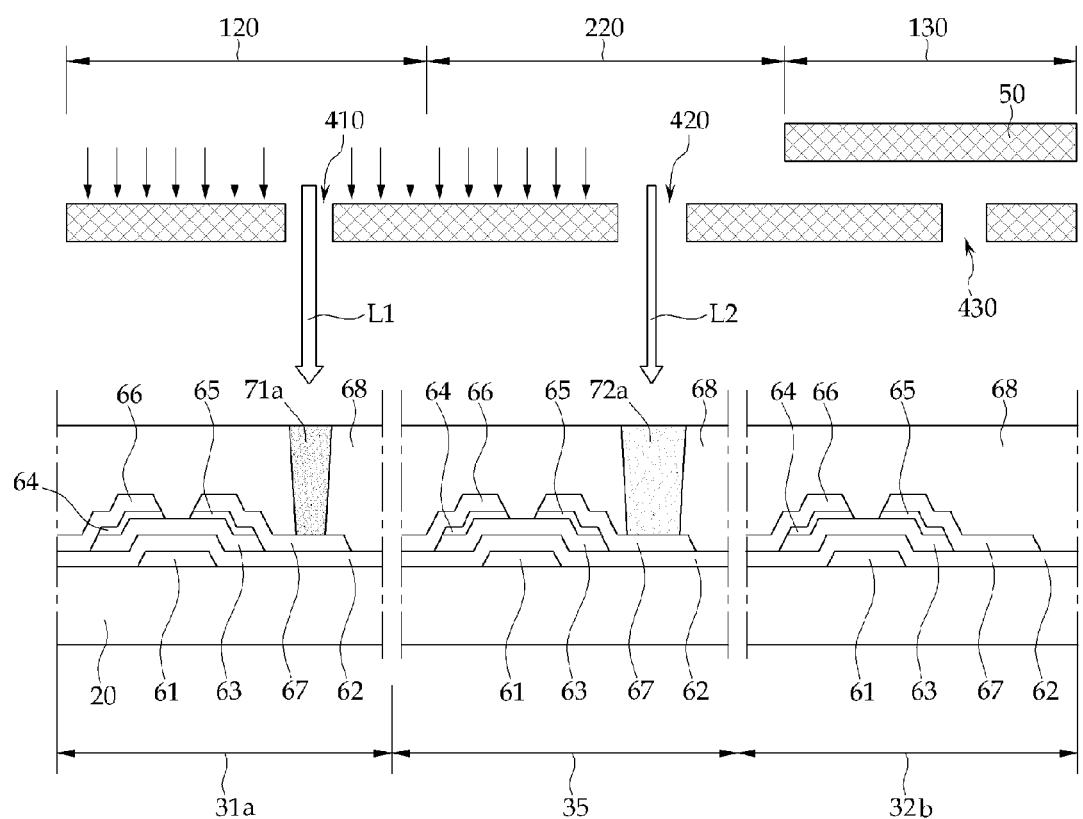
FIGS. 9A to 9C are cross-sectional views showing a method of forming contact holes of a display device using an exposure mask according to an embodiment.
Figure 9B:
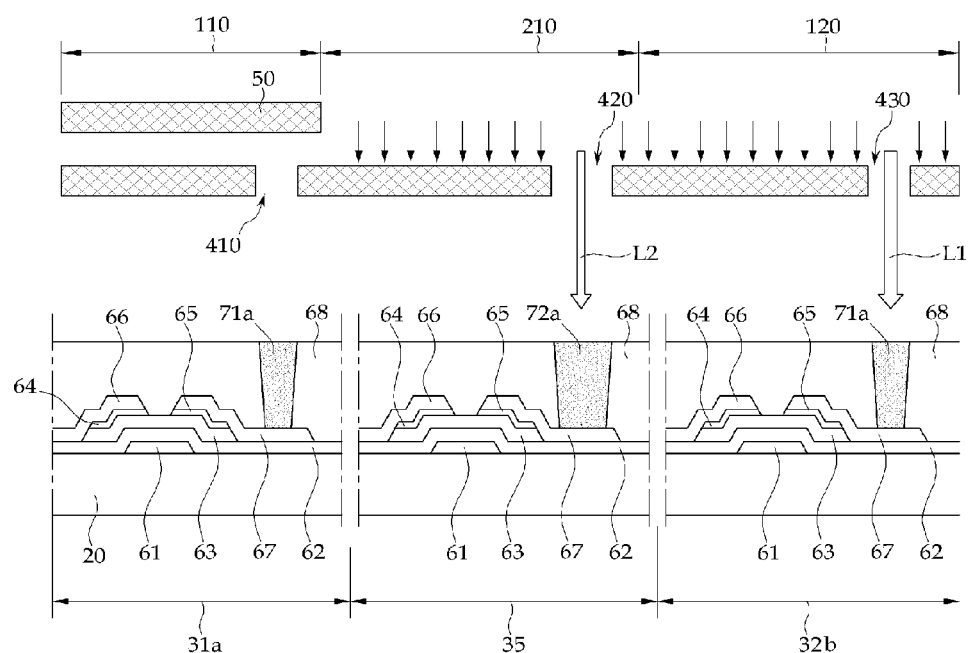
Figure 9C:
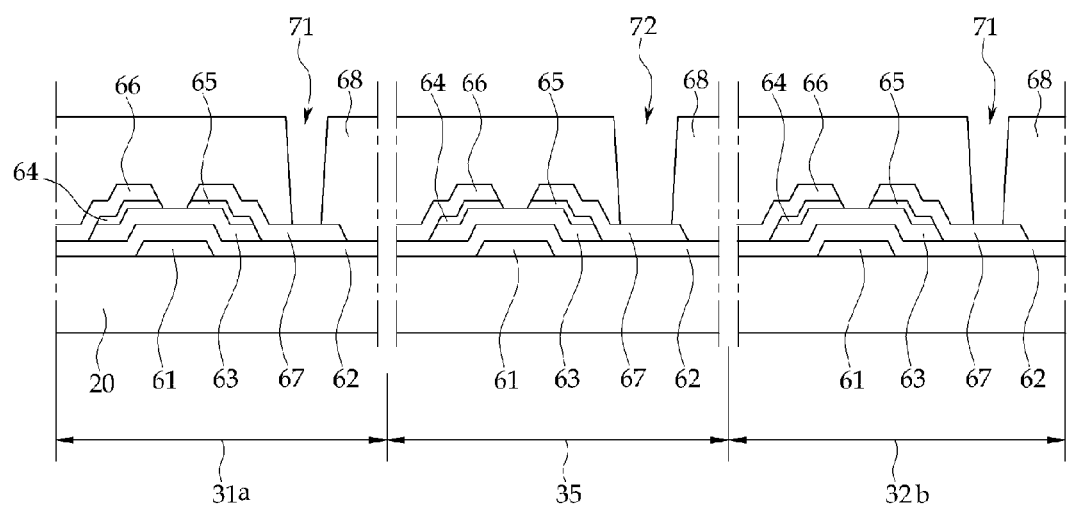

FIGS. 9A to 9C are cross-sectional views showing a method of forming a contact hole of a display device using an exposure mask according to an embodiment.

Among the configurations of the display device described above, the process of forming the contact holes 71 and 72 in the passivation layer 68 will be described below by taking the first and second shots of the divisional exposure as an example. A contact hole formed in the fifth sub-region 35 of the mother substrate 20 and the boundary areas 31a and 32b adjacent to the fifth sub-region 35 will be described as an example. Description of the exposure mask 10 will also focus on an area corresponding to the fifth sub-region 35 of the mother substrate 20 and its adjacent areas.

Referring to FIG. 9A, in the first shot, the exposure mask 10 is positioned over the first sub-region 31, the fifth sub-region 35, and the boundary area 32b. In the first shot, the second light transmission portion 130 of the right side of the exposure mask 10 is covered with a mask blind 50 so that the boundary area 32b is not exposed to light. The exposer irradiates light L1 with an intensity of 100% onto the first light transmission portion 120 of the exposure mask 10. The light L1 with an intensity of 100% is irradiated onto the contact hole 71 forming area that is the boundary area 31a of the first sub-region 31 through the exposure mask 10. Further, the exposer irradiates light L2 with an intensity of about 1% to about 50% onto the third light transmission portion 220 of the exposure mask 10 and the light L2 with an intensity of about 1% to about 50% is irradiated onto the contact hole 72 forming area of the fifth sub-region 35 through the exposure mask 10. The contact hole-forming area 71a of the first sub-region 31 is exposed to a sufficient intensity of light to be removed in a developing process. However, the contact hole-forming area 72a of the fifth sub-region 35 is not yet exposed to a sufficient intensity of light to be removed in the developing process. Meanwhile, the third mask pattern 420 is larger than the first mask pattern 410 and thus the contact hole-forming area 72a of the fifth sub-region 35 is formed to be larger than the contact hole-forming area 71a of the first sub-region 31.

Referring to FIG. 9B, in the second shot, the exposure mask 10 is positioned over the boundary area 31a, the fifth sub-region 35, the second sub-region 32, and the boundary area 32b. In the second shot, the second light transmission portion 110 of the left side of the exposure mask 10 is covered with the mask blind (not shown) so that the boundary area 31a is not exposed to light. The exposer irradiates light L1 with an intensity of 100% onto the first light transmission portion 120 of the exposure mask 10. The light L1 with an intensity of 100% is irradiated onto the boundary area 32b through the exposure mask 10. Further, the exposer irradiates light L2 with an intensity of about 1% to about 50% onto the third light transmission portion 210 of the exposure mask 10 and the light L2 with an intensity of about 1% to about 50% is irradiated onto the fifth sub-region 35 through the exposure mask 10. Accordingly, the fifth sub-region 35 is exposed twice after the second shot, and thus may be removed in the developing process.

Referring to FIG. 9C, the contact hole 72 of the fifth sub-region 35 exposes the drain electrode 67 in contrast to FIG. 4. The contact hole 72 of the fifth sub-region 35 is formed to be larger than the contact hole 71 of the first sub-region 31 because the third mask pattern 420 is larger than the first mask pattern 410.

According to the process of forming the contact hole illustrated in FIGS. 9A to 9C, defects in the contact holes caused in the second region, which is the overlapping exposed area, can be reduced.

An etching process including the exposure according to the exposure mask 10 will be described as follows. The first region of the first substrate 30 typically includes three or more sub-regions, but for ease of description, the first region will be described as having three sub-regions as an example.

A non-etched layer or an insulating layer is formed on a substrate partitioned into the three first regions and two second regions interposed between the first regions. A photoresist is coated on the non-etched layer. The photoresist in the primary first region and the second region adjacent to the primary first region are exposed to light having different light intensities through the exposure mask. Next, the photoresist in the secondary first region and the second region adjacent to the secondary first region are exposed to light having different light intensities through the exposure mask. Then, the photoresist in the tertiary first region and the second region adjacent to the tertiary first region are exposed to light having different light intensities through the exposure mask. The exposed photoresist is developed to form a photoresist pattern. The non-etched layer on the substrate is etched using the photoresist pattern. The photoresist pattern is then stripped.

As used above, the non-etched layer refers to a thin film (metal layer, insulating layer, semiconductor layer, or the like) for patterning.

According to at least one embodiment, each of the first regions is exposed once and each of the second regions is exposed twice. The light intensity irradiated onto the second region is about 1% to about 50% of the light intensity irradiated onto the first region as previously described.

The shape of the mask pattern 400 will be described below with reference to FIGS. 10A to 10D.

FIGS. 10A to 10D are plan views showing various embodiments relating to a first mask pattern and a third mask pattern on the exposure mask.

Figure 10A:
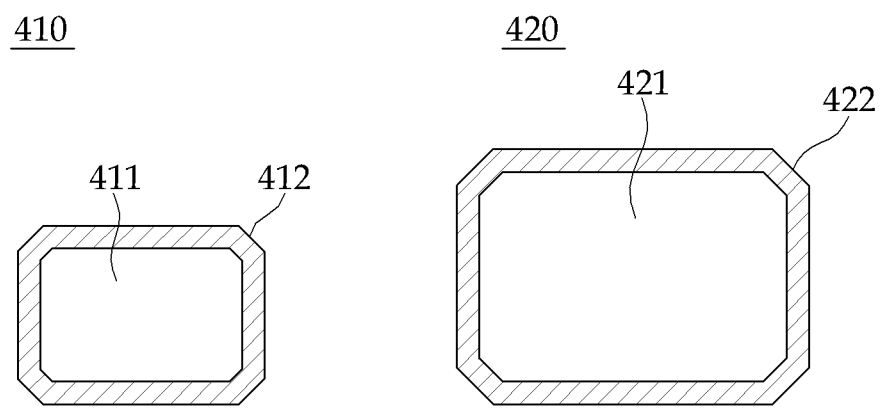
FIGS. 10A to 10D are plan views showing various embodiments relating to a first mask pattern and a third mask pattern formed on an exposure mask.

Referring to FIG. 10A, the first mask pattern 410 and the third mask pattern 420 can be circular or polygonal in shape. The first mask pattern 410 includes the light exposed area or light transmitting area 411 and the light blocking area or light blocking area 412. The light exposed area 411 has a short side of about 11 μm and a long side of about 14 μm. The third mask pattern 420 includes the light exposed area 421 and the light blocking area 422. The light exposed area 421 has a short side of about 13 μm and a long side of about 16 μm. Therefore, the third mask pattern 420 is about 1.4 times larger than the first mask pattern 410.

Figure 10B:
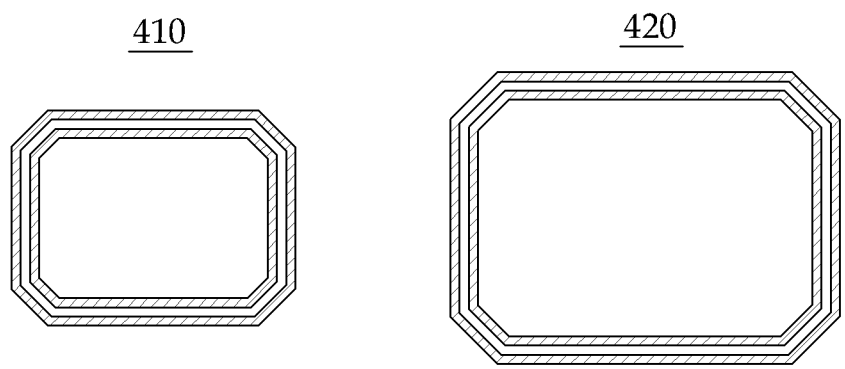

Referring to FIG. 10B, the first mask pattern 410 and the third mask pattern 420 include a slit. The first mask pattern 410 and the third mask pattern 420 include a first light transmitting portion, a first light blocking portion surrounding the first light transmitting portion, a second light transmitting portion surrounding the first light blocking portion, and a second light blocking portion surrounding the second light transmitting portion. The second light transmitting portion has a substantially slit shape. The light transmitting portion is a non-hatched area in FIG. 10B and the light blocking portion is a hatched area in FIG. 10B. The slit-shaped second light transmitting portion is about 2 μm and the entire area of the mask patterns illustrated in FIG. 10B is the same as that of the mask patterns illustrated in FIG. 10A. Meanwhile, when using a negative photoresists to be exposed to light, the light transmitting portion and the light blocking portion are reversed.

Figure 10C:
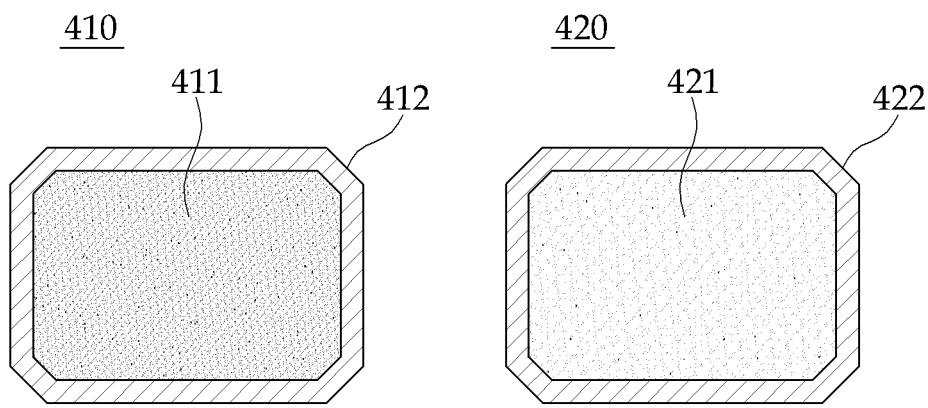

Referring to FIG. 10C, the first mask pattern 410 and the third mask pattern 420 are halftone mask patterns having the same shape. In this embodiment, the third mask pattern 420 has a higher transmittance than the first mask pattern 410. The transmittance can be adjusted to effectively form the contact hole.

Figure 10D:
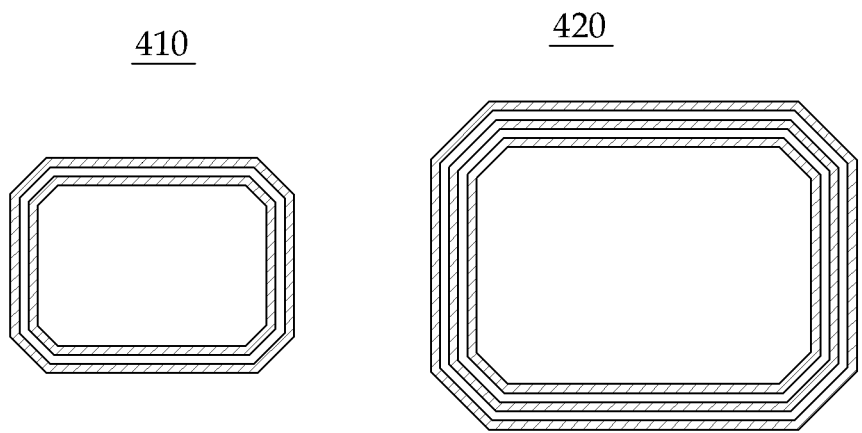

Referring to FIG. 10D, slits of the transparent part are added to edges of the mask patterns illustrated in FIG. 10B. The contact hole of the passivation layer has a larger area with more slits, thereby achieving improvement in image quality of a display device.

In summary, the mask patterns of FIG. 10A are suitable for forming a fine pattern, and the mask patterns having more slits, illustrated in FIGS. 10B and 10D, are provided with the contact holes having a larger area, and thus they are suitable for improving image quality. Accordingly, the mask patterns of FIGS. 10A to 10D may be appropriately selected in accordance with purposes of the patterns formed on the substrate. Additionally, the sized of the mask patterns and slits in each of FIGS. 10A to 10D can be variously modified according to the design requirements of the display device.

Based on the above description, it will be appreciated that various embodiments of the invention have been described herein for purposes of illustration, and that various modifications can be made without departing from the scope and spirit of the invention. Accordingly, the various embodiments disclosed herein are not intended to be limiting, with the true scope and spirit being defined by the following claims, and equivalents thereof.

What is claimed is:

1. A display device comprising:
   a substrate having a first and a second region;
   a gate line and a data line on the substrate;
   a plurality of thin film transistors in the first and second region, being connected to the gate line and the data line; and
   a plurality of pixel electrodes connected to the plurality of the thin film transistors respectively,
   wherein the first and second region are adjacent each other and the second region has a second contact hole of which an area is larger than that of a first contact hole of the first region and wherein the thin film transistor of the first region contacts the pixel electrode through the first contact hole and the thin film transistor of the second region contact the pixel electrode through the second contact holes.

2. The display device of claim 1, wherein the area of the second contact hole is about 1.3 times to about 1.5 times the area of the first contact hole.

3. The display device of claim 1, wherein the first contact hole and the second contact hole are provided in the same layer.

4. The display device of claim 3, wherein the first contact hole and the second contact hole expose any one of a semiconductor layer, a drain electrode, a gate line, a data line, and a pad electrode.

5. The display device of claim 1, wherein the second region comprises any one of the gate line and the data line.

6. The display device of claim 1, wherein the second region comprises a driving circuit.

* * * * *